United States Patent
Hossain et al.

(10) Patent No.: US 12,364,055 B2
(45) Date of Patent: Jul. 15, 2025

(54) EFFICIENT AND COST-EFFECTIVE PHOTONIC COOLER BASED IR FILTERING FOR PHOTOVOLTAICS AND ENERGY EFFICIENCY APPLICATIONS

(71) Applicant: Qatar Foundation for Education, Science and Community Development, Doha (QA)

(72) Inventors: Mohammad Istiaque Hossain, Doha (QA); Brahim Aïssa, Doha (QA)

(73) Assignee: HAMAD BIN KHALIFA UNIVERSITY, Doha (QA)

( * ) Notice: Subject to any disclaimer, the term of this patent is extended or adjusted under 35 U.S.C. 154(b) by 424 days.

(21) Appl. No.: 18/090,968

(22) Filed: Dec. 29, 2022

(65) Prior Publication Data

US 2023/0231061 A1    Jul. 20, 2023

Related U.S. Application Data

(60) Provisional application No. 63/294,652, filed on Dec. 29, 2021.

(51) Int. Cl.
| | | |
|---|---|---|
| *H10F 77/42* | (2025.01) | |
| *G02B 5/20* | (2006.01) | |
| *G02B 5/26* | (2006.01) | |
| *G02B 5/28* | (2006.01) | |
| *H10F 77/60* | (2025.01) | |

(52) U.S. Cl.
CPC ............. *H10F 77/42* (2025.01); *G02B 5/208* (2013.01); *G02B 5/26* (2013.01); *G02B 5/282* (2013.01); *H10F 77/60* (2025.01)

(58) Field of Classification Search
CPC ........... H10F 77/42; G02B 5/208; G02B 5/26; G02B 5/282
See application file for complete search history.

(56) References Cited

U.S. PATENT DOCUMENTS

| | | |
|---|---|---|
| 8,749,529 B2 | 6/2014 | Powell et al. |
| 9,379,343 B2 | 6/2016 | Leem et al. |
| 10,110,833 B2 | 10/2018 | Teich et al. |
| 10,151,946 B2 | 12/2018 | Jiang et al. |
| 11,211,513 B2 | 12/2021 | Hermes et al. |
| 2019/0277703 A1 | 9/2019 | Valouch et al. |
| 2019/0375678 A1* | 12/2019 | Boyce .................... G02B 1/002 |

FOREIGN PATENT DOCUMENTS

| | | |
|---|---|---|
| CN | 109923372 A | 6/2019 |
| JP | S6058690 A | 4/1985 |

OTHER PUBLICATIONS

Abundiz-Cisneros et al., "Novel Low-E Filter for Architectural Glass Pane", Energy and Buildings (2020), vol. 206, pp. 1-22. (Proof copy).

(Continued)

*Primary Examiner* — Matthew L Reames
(74) *Attorney, Agent, or Firm* — K&L Gates LLP (57) ABSTRACT

A filter for infrared radiation is provided as a photonic cooler coating. The filter for infrared radiation includes a first metal oxide; a second metal oxide; and a metal layer, wherein the first metal oxide layer is provided between the second metal oxide layer and the metal layer.

19 Claims, 9 Drawing Sheets

(56) References Cited

OTHER PUBLICATIONS

Choi et al., "ITO/Ag/ITO Multilayer Films for the Application of a Very Low Resistance Transparent Electrode", Thin Solid Films (1999), 341(1-2), pp. 152-155.

Chu et al., "AZO/Au/AZO Tri-Layer Thin Films for the Very Low Resistivity Transparent Electrode Applications", Materials Science and Engineering: B (2014), 186(1) pp. 117-121.

Hossain et al., "Numerical and Experimental Investigation of Infrared Optical Filter Based on Metal Oxide Thin Films for Temperature Mitigation in Photovoltaics", Journal of Electronic Materials (2021), vol. 51, pp. 179-189.

Kim, D.H et al., "Thermally Evaporated Indium-Free, Transparent, Flexible SnO2/AgPdCu/SnO2 Electrodes for Flexible and Transparent Thin Film Heaters", Scientific Reports (2017), 7(1), pp. 1-15.

Kim, H.K et al., "Flexible IZO/Ag/IZO/Ag Multilayer Electrode Grown on a Polyethylene Terephthalate Substrate Using Roll-to-Roll Sputtering", Nanoscale Research Letters (2012), 7(1), pp. 1-8.

Koçak et al., "Production of NiO, NiO/Ag, NiO/Au, and NiO/Pt Hollow Spheres by Using Block Copolymer Stabilized Microspheres as a Template", Journal of Applied Polymer Science (2021), 138(44), pp. 51299.

Liang et al., "Preparation of High-Performance Metal-Free UV/Near Infrared-Shielding Films for Human Skin Protection", Nanomaterials (2021), 11(8), pp. 1-20.

Liang et al., "Influence of Film Thickness on the Texture, Morphology and Electro-Optical Properties of Indium Tin Oxide Films", Thin Solid Films (2010), 519(1), pp. 345-350.

Liang et al., "High-Rate and Low-Temperature Growth of ZnO:Ga Thin Films by Steered Cathodic Arc Plasma Evaporation", Applied Surface Science (2013), vol. 265, pp. 621-629.

Loka et al., "Multi-Functional TiO2/Si/Ag (Cr)/TiNx Coatings for Low-Emissivity and Hydrophilic Applications", Applied Surface Science (2016), vol. 363, pp. 439-444.

Majumder et al., "NiO/Ag Heterostructure: Enhanced UV Emission Intensity, Exchange Interaction and Photocatalytic Activity", RSC Advances (2016), 6(61), pp. 56503-56510.

Sahm et al., "Oxidation Behaviour of Thin Silver Films Deposited on Plastic Web Characterized by Spectroscopic Ellipsometry (SE)", Thin Solid Films (2004), vol. 455, pp. 819-823.

Stamate, Eugen, "Spatially Resolved Optoelectronic Properties of Al-Doped Zinc Oxide Thin Films Deposited by Radio-Frequency Magnetron Plasma Sputtering Without Substrate Heating." Nanomaterials (2020), 10(1), pp. 1-11.

Tan et al., "PMMA-ITO Composite Formation via Electrostatic Assembly Method for Infra-Red Filtering", Nanomaterials (2019), 9(6), pp. 1-9.

Tien et al., "Accurate Prediction of Multilayered Residual Stress in Fabricating a Mid-Infrared Long-Wave Pass Filter with Interfacial Stress Measurements", Optics Express (2020), 28(24), pp. 36994-37003.

Zhao, P. et al., "Characteristics of Indium Zinc Oxide/Silver/Indium Zinc Oxide Multilayer Thin Films Prepared by Magnetron Sputtering as Flexible Transparent Film Heaters", Thin Solid Films (2018), vol. 665, pp. 137-142.

Zhao, S et al., "Optical Constants of Sputtered Ni/NiO Solar Absorber Film—Depth-Profiled Characterization", Solar Energy Materials and Solar Cells (2004), 84(1-4), pp. 193-203.

* cited by examiner

EFFICIENT AND COST-EFFECTIVE PHOTONIC COOLER BASED IR FILTERING FOR PHOTOVOLTAICS AND ENERGY EFFICIENCY APPLICATIONS

PRIORITY CLAIM

The present application claims priority to and the benefit of U.S. provisional patent application No. 63/294,652 filed on Dec. 29, 2021, the entirety of which is incorporated herein by reference.

BACKGROUND

Solar spectrum consists of three spectral ranges: ultraviolet, visible, and infrared radiation, which is responsible for heat generation. Due to infrared radiation's heat generation, the window temperatures of a building may reach up to 70° C. in the summer season, especially in desert regions. This, in turn, increases the energy and resources required to maintain a desired temperature within the building. To reduce energy budgets and conserve resources, optical filters have been used that allow visible spectral ranges to pass through a window while reflecting or minimizing the absorption of infrared radiation. Through the use of an infrared filter, a window can minimize heat absorption while maintaining a desirable level of optical transmissivity for the visible range. However, current infrared filters have many disadvantages.

For example, windows coated with metal nano-sheets have been used to act as an infrared filter. However, the metals used, such as Ag, Al, and Au, are unstable when exposure to moisture and high heat, which cause issues with oxidization and delamination and cracking of the metal thin films. In an attempt to solve these issues, studies have investigated the use of stacked layers, including $MoO_x/Ag/MoO_x$. Despite the stacked structure, oxidization remains an issue due to oxygen diffusion, resulting in fractured films caused by in-situ stress. Other studies suggest the use of a doped transparent conductive oxide ("TCO") as an infrared filter with a stacked structure of TCO/metal/TCO, but large-scale development is not feasible due to a low cutoff percentage in the infrared radiation region. Thus, optimized filters that reflect infrared radiation in the light spectrum to minimize heat absorption for producing a photonic cooler application are needed.

SUMMARY

The present disclosure generally relates to an infrared radiation filter. In light of the present disclosure, and without limiting the scope of the disclosure in any way, in an aspect of the present disclosure, which may be combined with any other aspect listed herein unless specified otherwise, an infrared radiation filter is provided. The infrared radiation filter comprises: a metal layer; a first metal oxide layer; and a second metal oxide layer, wherein the first metal layer is provided between the second metal oxide layer and the metal layer.

In an aspect of the present disclosure, which may be combined with any other aspect listed herein unless specified otherwise, the first metal oxide layer and the second metal oxide layer are $TiO_x$, $MoO_x$, or $NiO_x$ where x is greater than zero.

In an aspect of the present disclosure, which may be combined with any other aspect listed herein unless specified otherwise, the metal layer is Ag or Al.

In an aspect of the present disclosure, which may be combined with any other aspect listed herein unless specified otherwise, the first metal oxide layer is $MoO_x$ or $NiO_x$ where x is greater than zero.

In an aspect of the present disclosure, which may be combined with any other aspect listed herein unless specified otherwise, the second metal oxide layer is $TiO_x$ where x is greater than zero.

In an aspect of the present disclosure, which may be combined with any other aspect listed herein unless specified otherwise, $TiO_x$ has a varying stoichiometry within the second metal oxide layer.

In an aspect of the present disclosure, which may be combined with any other aspect listed herein unless specified otherwise, the metal layer is Ag, the first metal oxide layer is $MoO_x$, and the second metal oxide layer is $TiO_x$ where x is greater than zero.

In an aspect of the present disclosure, which may be combined with any other aspect listed herein unless specified otherwise, the metal layer is Al, the first metal oxide layer is $MoO_x$, and the second metal oxide layer is $TiO_x$ where x is greater than zero.

In an aspect of the present disclosure, which may be combined with any other aspect listed herein unless specified otherwise, the metal layer is Ag, the first metal oxide layer is $NiO_x$, and the second metal oxide layer is $TiO_x$ where x is greater than zero.

In an aspect of the present disclosure, which may be combined with any other aspect listed herein unless specified otherwise, the metal layer is Al, the first metal oxide layer is $NiO_x$, and the second metal oxide layer is $TiO_x$ where x is greater than zero.

The reader will appreciate the foregoing details, as well as others, upon considering the following detailed description of certain non-limiting embodiments including a filter for infrared radiation according to the present disclosure.

BRIEF DESCRIPTION OF THE DRAWINGS

The accompanying figures depict various elements of the one or more embodiments of the present disclosure, and are not considered limiting of the scope of the present disclosure.

In the Figures, some elements may be shown not to scale with other elements so as to more clearly show the details. Additionally, like reference numbers are used, where possible, to indicate like elements throughout the Figures.

DETAILED DESCRIPTION

The present disclosure generally relates to a filter for infrared radiation. Conventional infrared radiation filters have many disadvantages. For example, metal nano-sheets are unstable when exposed to moisture and high heat due to oxidization issues. Further, stacked layers with the structure of $MoO_x/Ag/MoO_x$ result in metal oxidization from oxygen diffusion, which results in fractured films due to in-situ stress. Thus, aspects of the present disclosure may address the above-discussed constraints in conventional filters.

According to an embodiment of the present disclosure, the filter may include three different components: a metal layer; a first metal oxide layer; and a second metal oxide layer, wherein the first metal oxide layer is provided between the second metal oxide layer and the metal layer.

An embodiment of the present disclosure may provide an efficient infrared filter from stacked nanostructured thin films while maintaining a high degree of control over growth parameters, stability, and light transmissivity in the visible range for a photonic cooler application. Namely, the filter can include the stacked configuration of a metal layer; a first metal oxide layer; and a second metal oxide layer, wherein the first metal oxide layer is provided between the second metal oxide layer and the metal layer.

In various embodiments, the infrared radiation filter may include a stacked configuration where the metal layer is Al, the first metal oxide layer is $MoO_x$, and the second metal oxide layer is $TiO_x$ where x is greater than zero. In many embodiments, the infrared radiation filter may include $NiO_x$ as the first metal layer within the stacked configuration. Further, the infrared radiation filter may include Ag as the metal layer. Thus, to provide a number of example configurations, the infrared radiation filter may include a stacked configuration of $Ag/NiO_x/TiO_x$, $Al/MoO_x/TiO_x$, $Ag/MoO_x/TiO_x$, $Al/NiO_x/TiO_x$.

The combination of $MoO_x/TiO_x$ and $NiO_x/TiO_x$ layers has shown higher light transmittance in the visible range compared with the single $TiO_x$ layer. Furthermore, light transmittance begins to decrease for both stacked layers in the near infrared region. The addition of a metal layer may result in wavelength cut-off starting from 800 nm by reflecting (>70%) of light. In various embodiments, the infrared radiation filter was developed using a physical vapor deposition system and considering key optical parameters using OptiLayer software simulations. Both the experimental and computational results confirm that using a stacked configuration of a metal layer, a first metal oxide layer, and a second metal oxide layer, where the first metal oxide layer is $MoO_x$ or $NiO_x$ and the second metal oxide layer is $TiO_x$, outperform other stacked filters, such as those that include a $SnO_x$ layer.

Figure 1:
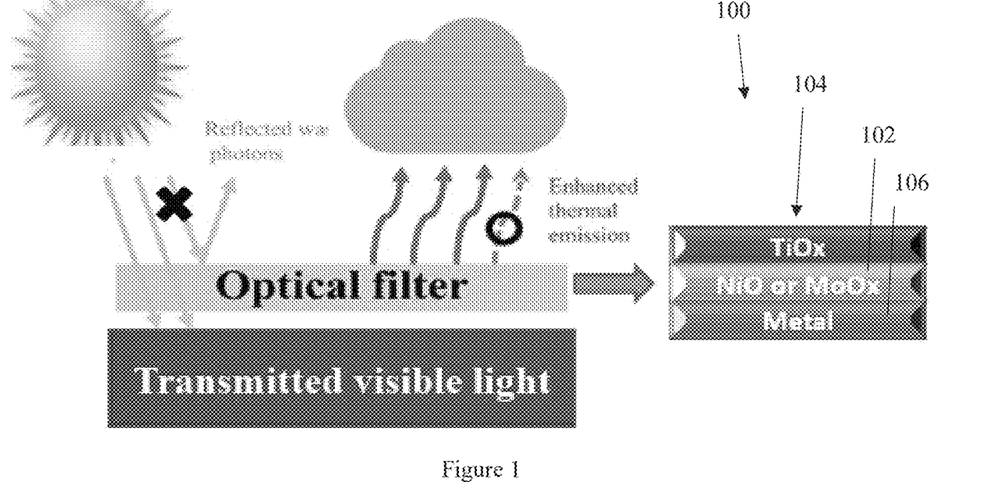
FIG. 1 illustrates an infrared radiation filter, according to embodiment of the present disclosure.

FIG. 1 illustrates an infrared radiation filter 100, according to an embodiment of the present disclosure. The filter 100 includes a layer of $NiO_x$ or $MoO_x$ 102 as a first metal oxide; a layer of $TiO_x$ 102 as a second metal oxide; and a metal layer 106. The $TiO_x$ layer can have a varying stoichiometry such that x can be different in varying parts of the $TiO_x$ layer, where x is greater than zero. By varying the stoichiometry through the control of the oxygen flow during a physical evaporation growth process, the $TiO_x$ layer 102 results in a film with super-hydrophilic and self-cleaning properties. Based on these properties, the infrared filter includes an anti-soiling property, which can be advantageous, especially in geographic locations where accumulated dust is in an issue, such as in the Middle East and North African regions. Moreover, the anti-soiling properties can also be leveraged for other applications, including photovoltaic panels. In an example, the structured infrared filter allows the visible spectrum to pass with a high transmittance while minimizing the transmittance of infrared radiation. Further, the metal layer 106 can result in wavelength cut-off starting from 800 nm by reflecting over 70% of the light. Thus, filter 100 may produce a photonic cooling for windows using nanostructured thin films.

The infrared radiation filter 100 depicted in FIG. 1 illustrates an example embodiment of a radiation filter used during experimental and numerical analysis. Namely, infrared radiation filter 100 was tested using Ultraviolet-visible spectroscopy ("UV-Vis spectroscopy"). Examples of the equipment and analysis used include: Perkin Elmer Lambda 1050 UV/Vis/NIR spectrophotometer, Field-Emission Scanning Electron Microscopy ("FESEM"), and XPS Escalab 250Xi. XPS spectra analysis and fitting was conducted using Avantage software while an X-ray diffraction tool was used to find the structural properties. Also, simulations were completed using OptiLayer software to identify the minimum obtainable optical reflectance, using refractive index values for the different metal oxide layers measured using an ellipsometer. Further, contact angle measurements were conducted to assess the level of hydrophilic property of the films using a Kruss tool. For surface roughness analysis, a stylus profilometer was employed. Simulations were carried out using OptiLayer software to identify the minimum obtainable optical reflectance, using experimental refractive index values for the different metal oxide layers measured using an ellipsometer (Horiba UVISEL 2).

Figure 2:
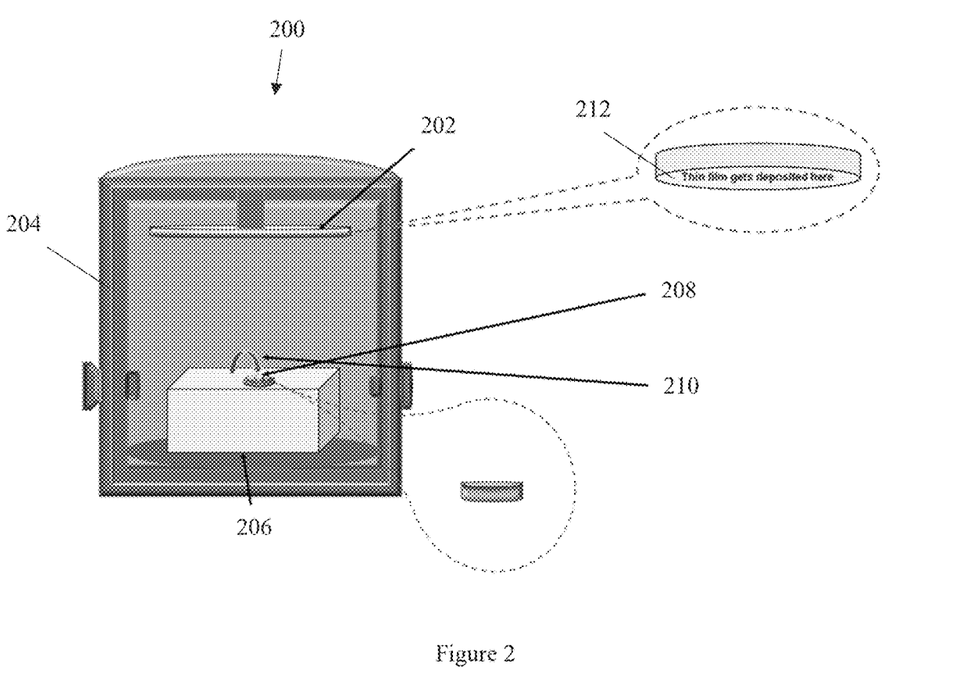
FIG. 2 illustrates a schematic representation of an e-beam evaporation process, according to an embodiment of the present disclosure.

FIG. 2 illustrates a schematic representation of an e-beam evaporation process for fabricating the infrared radiation filter 100, according to an embodiment of the present disclosure. The metal layer 106 may be deposited with an optimized e-beam evaporator 200, which controls growth parameters such as thicknesses of the deposited films and oxygen content during the film growth process onto a large-scale substrate without breaking the vacuum. The substrate might be a transparent glass or any flexible polymeric substrate such as Polyethylene terephthalate ("PET") or any other transparent material. The optimized e-beam evaporator 200 includes a thin film deposition area 202 enclosed within a vacuum system 204. Within the vacuum system 204, an electron gun 206 is used to direct a source material 208 within a crucible 210 in the form of an electron beam onto the thin film 212 to complete the process of thin film deposition.

In further embodiments, a multi-stack of metal oxide/metal oxide/metal films using thermal e-beam evaporation to be used as near infrared light filter, anti-dust and antireflective coatings is provided. The optimized multi-stacking structure considers $TiO_2$ (50 nm) as top layer, NiO (300 nm) as the buffer layer, and Ag (20 nm) as the reflective layer of the near infrared (NIR) light spectrum. The entire stacked layers were developed without breaking the vacuum where the oxides layers were grown reactively with the deposition pressure of 2e-4 Torr. $TiO_2$ layers have been proved superhydrophilic through controlling the oxygen flow during the reactive physical-evaporation growth process, which additionally provided a self-cleaning property of the IR-filters. Filtration (i.e. cutoff) of the infrared spectrum while keeping the transmittance of the visible light has been improved with the stacking configuration of inorganic metal oxide (Low refractive index, $TiO_2$)/metal oxide (High refractive index, NiO, $MoO_x$)/metal layer (Ag, Al). The films were grown with the following structures $Ag/NiO_x/TiO_x$, $Al/NiO_x/TiO_x$, $Ag/MoO_x/TiO_x$, $Al/MoO_x/TiO_x$. The tripe-layer filter configurations were characterized optically and structurally using ultraviolet-visible (UV-Vis) spectrometry, ellipsometry, three-dimensional (3D) profilometry, x-ray diffraction analysis, and scanning electron microscopy. Among all, $MoO_x/TiO_x$ and $NiO_x/TiO_x$ layers have shown higher transmittance (T %) in the visible range compared with the single $TiO_x$ layer, then T % starts to decrease for both stacked layers in the NIR region. Later, adding a metal layer of (Ag or Al) results in wavelength cut-off starting from 800 nm by reflecting (>70%) of light. The results confirm that that the development of such coatings have commercialization potential due to its multi-functionalities such as IR filtering, anti-reflection coating in the visible range, and anti-soiling coating.

The radiated solar spectrum on earth has three main sub-bodies namely ultraviolet (UV), visible, and infrared (IR). The proportion of the IR spectrum is higher than visible and UV with 54% of incident radiation. See Abundiz-Cisneros, N., R. Sangines, R. Rodríguez-López, M. Peralta-Arriola, J. Cruz, and R. Machorro. "Novel Low-E filter for architectural glass pane." Energy and Buildings 206 (2020): 109558. This part of solar spectrum is the main reason of heat on glass substrates by converting accumulated infrared wavelength into thermal energy. As studied previously, temperature of a glass substrate during daytime can reach up to 50° C., which eventually results in heat generation. Zhao, Pin, Seohan Kim, Seonghwan Yoon, and Pungkeun Song. "Characteristics of indium zinc oxide/silver/indium zinc oxide multilayer thin films prepared by magnetron sputtering as flexible transparent film heaters." Thin Solid Films 665 (2018): 137-142. The energy consumption of a building increases significantly due to this phenomenon. Never the less, the entire wavelength range of IR spectrum from 760 nm to 1 mm cab cause skin cancer if a human body is exposed under such light spectrum for longer period of time. Thus, developing stacked layers to meet the purpose of reflecting IR spectrum becomes inevitably important without disturbing other functionalities such as higher transmission of visible light and functioning as an anti-soiling coating. The mechanism can be simplified through developing a smart thin film layers which will reflect back the IR spectrum starting from 760 nm with a high transmissivity (T) in the visible range (>75%). High-T % in the visible range is essential to save the daylight and to generate the highest power for photovoltaic (PV) applications through absorbing the photon energy in the visible range. Such approach will certainly mediate the thermodynamics of PV devices through mitigating temperature issue. Hossain, M. I., A. Khandakar, M. E. H. Chowdhury, S. Ahmed, M. M. Nauman, and B. Aïssa. "Numerical and Experimental Investigation of Infrared Optical Filter Based on Metal Oxide Thin Films for Temperature Mitigation in Photovoltaics." Journal of Electronic Materials (2021): 1-11. Multiple thin sheet of metal layers such as Ag, Al, Au have been suggested to be used as filtering IR spectrum due to the capabilities of absorbing resonance frequency in the infrared range. Though IR filtration is relatively higher than any other smart coating, stability is a major drawback to use such layers for longer period of time due to oxidization. Later, sandwich structures have been developed keeping such metal layer in between oxide layers to restrict oxidization issue with the structure of $MoO_x/Ag/MoO_x$. However, oxygen diffusion of moly-oxide becomes obvious and in-situ stress of such films results in fractured films. Liang, Chih-Hao, Sheng-Chau Chen, Xiaoding Qi, Chi-San Chen, and Chih-Chao Yang. "Influence of film thickness on the texture, morphology and electro-optical properties of indium tin oxide films." Thin Solid Films 519, no. 1 (2010): 345-350. Such degraded films result in a poor light management in the visible range as scattering takes place in the top layer. Thus, developing IR filter has to meet the criteria of visible light maximization. Some research works also carried out also to develop such filter using doped transparent conductive oxide (TCO) as such TCOs have been identified as thermally and chemically stable. Even though stability is not an issue, large scale deployment is not feasible due to lower IR cutoff percentage. Stacked layers using TCOs were suggested as well but without any solid numerical or experimental study. In some previous studies, NiO/Ag, NiO/Au, NiO/Ni, NiO/Pt stacked layers were developed for different applications such as UV light filtration, photocatalytic activity without the functionality of IR filtration. Various approaches with a very complex development process with high cost involvement put some other efforts unrealistic. Only four metal oxide films confirm the technical compatibility to develop such filters which are $TiO_x$, $SnO_x$, $MoO_x$, and $NiO_x$. $TiO_x$ layer has a large refractive index with self-cleaning property to make them suitable as a top layer for an IR filter. M. Mazur, D. Wojcieszak, J. Domaradzki, D. Kaczmarek, S. Song, and F. Placido, "TiO2/SiO2 multilayer as an antireflective and protective coating deposited by microwave assisted magnetron sputtering," Opto-Electronics Review, vol. 21 (2), pp. 233-238 (2013). For both $MoO_x$ and $NiO_x$, optical properties are suitable to be integrated in between high refractive index layer and a metal layer. Various physical vapor deposition techniques have been adapted to deposit these metal oxides films, including magnetron sputtering, vacuum evaporation and atomic layer deposition (ALD). Among these techniques, the e-beam evaporation deposition process is the most suitable technique mainly due its capability of fabricating large scale materials with pristine properties.

The goal of this work is to develop a simplified version of metal oxide/metal oxide/metal IR filter with multiple functionalities such as cost effective growth parameters and process for large-scale applications, better stability, high-T % in the visible range, and high-R % in the IR region, and with anti-soiling properties. Both numerical and experimental works have been considered to meet all the requirements. Thermal e-beam evaporation has been used to develop such multi-stacked filter of metal oxide/metal without breaking the vacuum. Such deposition technique allows in overall process control with reactive growth of the metal oxide layer without breaking the vacuum. Firstly, cost effective metal oxide layers of NiO with integrated metal layers (Ag, Al)

were validated to fabricate IR filters as shown in FIG. 1. The optical properties and microstructures were systematically investigated. A thin layer of $TiO_x$ was also tuned accordingly with super hydrophilic wetting behavior to be used as anti-soiling coating and to increase the light transmission in the visible range through coupling high refractive index and lower refractive index materials.

Metal oxide thin films (NiO and $TiO_x$) were grown using e-beam evaporation at room temperature at a very controlled deposition rate of 1 Å/s under a constant oxygen flow rate to maintain a deposition pressure of 2e-4 Torr. Metal layers (Al, Ag) were also grown on glass substrates using e-beam evaporation at room temperature at a very controlled deposition rate of 1 Å/s without any oxygen flow. The maximum flowrate was set to 20 sccm to restrict any arching due to free oxygen charge carriers. Samples were optically measured using Ellipsometry and ultraviolet-visible (UV-Vis) spectroscopy. In addition, the wetting behavior was characterized using contact angle measurements. In addition, surface topology was assessed by a three-dimensional (3D) stylus (Dektak) and the microstructure of the films was studied by field-emission scanning electron microscopy (FESEM). Structural characterization of the grown films was measured using x-ray photoelectron spectroscopy (XPS). At the beginning, thickness optimization was carried out for each layer to maximize the optical properties. The e-beam evaporation technique is quite similar but with better control to thermal evaporation. Where the source material is heated with a flux of electron beam. Our tool allows us to deposit multi-layers in a stacked manner without breaking the vacuum. The substrates with a dimension of 1'×3" were sonicated and cleaned using different solvents such as DI water, acetone, and isopropanol. Later, they were dried under inert nitrogen. The e-beam evaporation tool was a Denton Vacuum Explorer™ evaporator. The deposition pressures were fixed at 2e-4 Torr, while the oxygen flow was varied automatically by the evaporator to maintain the desired pressure. Two different material sources were used, namely Ni and Ti to deposit the metal oxide films reactively and Al and Ag pellets were used for the thin metal layer, all purchased from Kurt J. Lesker with purity of 99.9995%.

UV-Vis spectroscopy (PerkinElmer Lambda 1050 UV/VIS/NIR) and ellipsometry were employed for optical analysis (Horiba UVISEL 2), and contact angle (CA) measurements were carried out to assess the wettability (hydrophilicity/hydrophobicity) of the films by means of a Kruss tool. An Escalab 250Xi was employed for x-ray photoelectron spectroscopy (XPS) (Thermo Fisher Scientific) with a monochromatic Al Kα source at energy of 1486.68 eV, and Avantage software for spectral analysis and peak fitting. We used 100 eV for the XPS survey (one scan performed), and 20 eV for targeted and narrower scans (ten scans performed). We examined the morphology and thickness of the grown films by using a JEOL 7610 field-emission scanning electron microscopy (FESEM) apparatus. Three-dimensional average roughness was measured by using the Dektak stylus profilometer. Simulations were carried out by using OptiLayer software to identify the minimum obtainable optical reflectance, using refractive index values for the different metal oxide layers measured using an ellipsometer (Horiba UVISEL 2).

Figure 3:
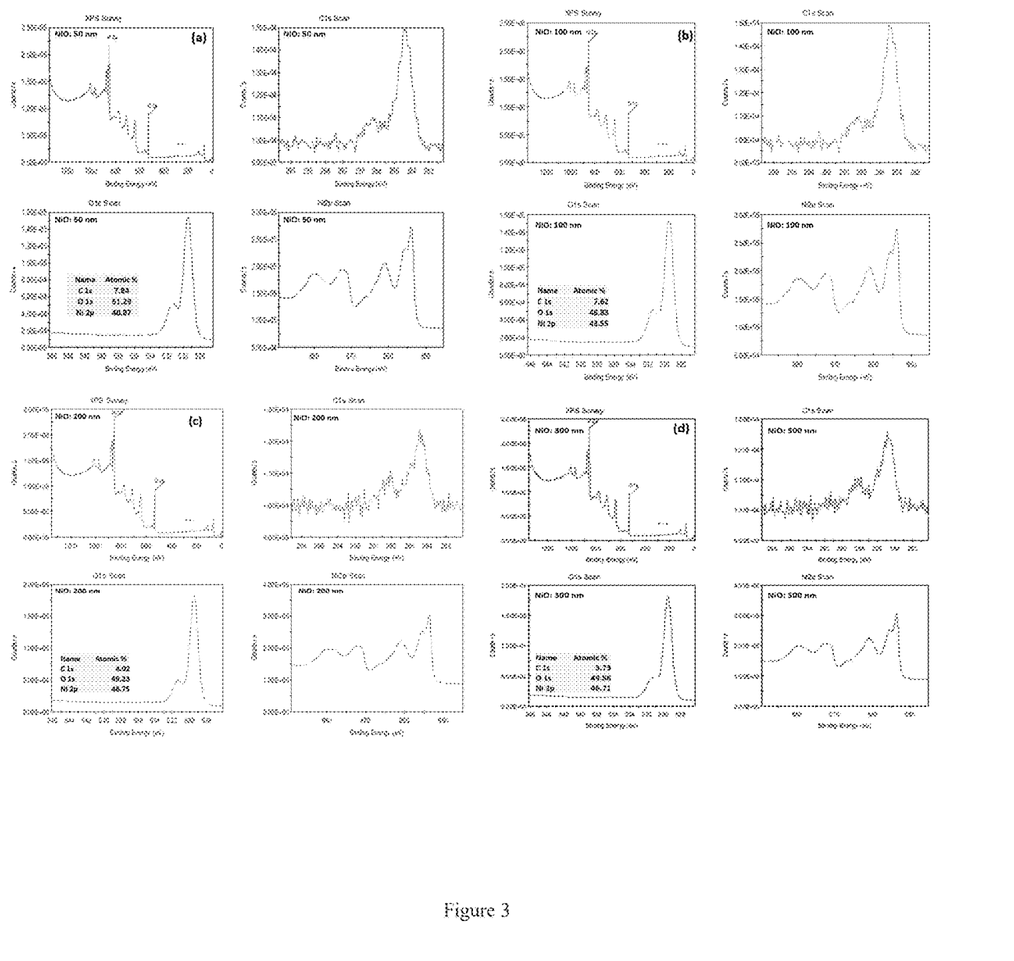
FIG. 3 includes views (a) to (d), which illustrate XPS surveys of NiO films grown at 2e-4 Torr with four different thicknesses (a) 50 nm, (b) 100 nm, (c) 200 nm, and (d) 300 nm.

FIG. 3, views (a) through (d), capture the X-ray photoelectron spectroscopy (XPS) analysis as fitted by Avantage software. The source used to excite electron is Al K alpha with an energy of 1486.68 eV, pass energy of 20 eV for all narrow scans and 100 eV for survey scans. During the high resolution scanning, each spectrum considers 10 scans with 1-survey spectra. As studied, survey spectrum confirms the growth of pristine Nickel oxide (NiO) films with a minimal carbon contamination. To consider a precise amount of oxygen, oxygen attached to carbon atoms have been deducted from the total number of oxygen atoms. In general, deposition pressure plays a significant role to turn surface into oxygen rich. A slight stoichiometric deviation range was found which confirms the optimize growth of such metal oxide films. The measured oxygen spectra was fitted with mainly carbon related and oxide related. In $NiO_x$ samples, the stoichiometry was around $NiO_{0.84}$. Some of the previous works reported about the Zn doping along with overlapping of Al 2s and Ni 3s peaks.

Figure 4:
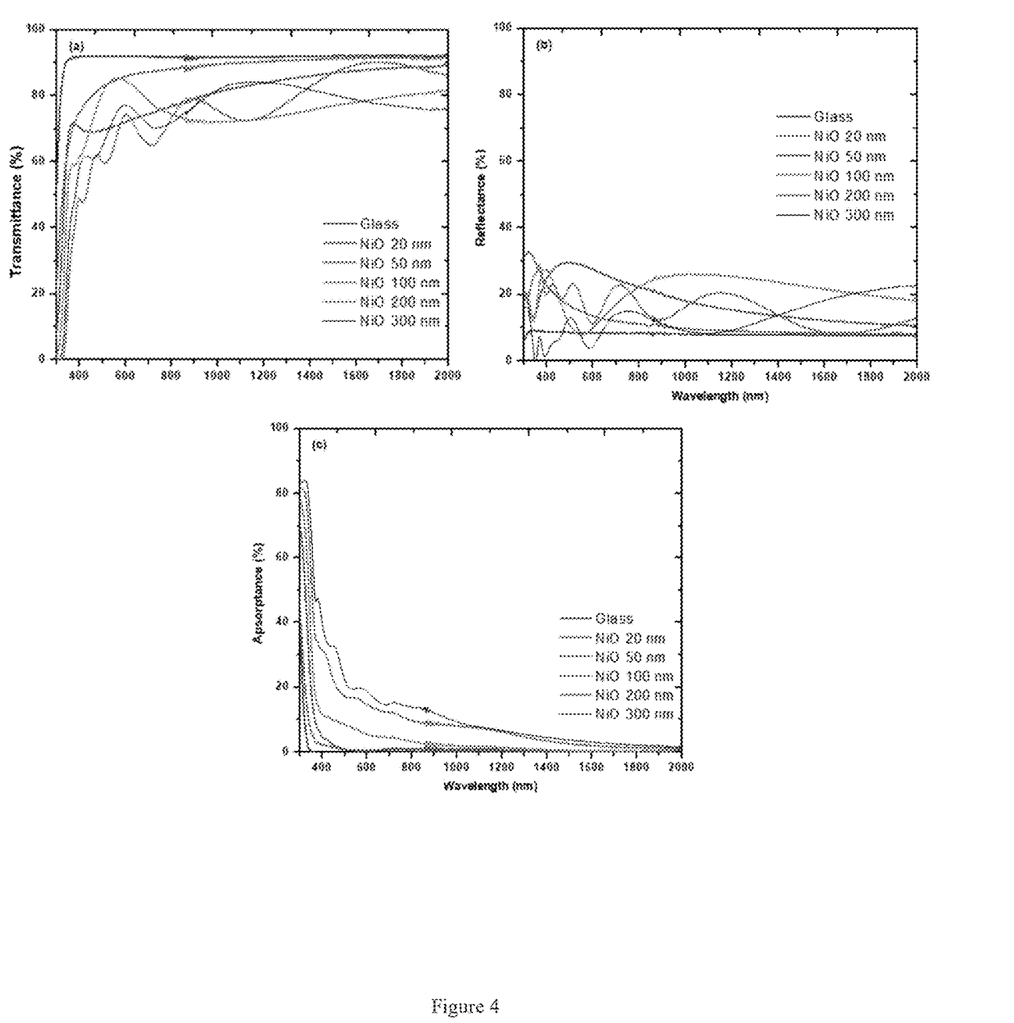
FIG. 4 includes views (a) to (c), which illustrate UV-Vis results of NiO films grown at 2e-4 Torr with different thicknesses: (a) transmittance (%), (b) reflectance (%), and (c) absorptance (%).

The optical properties of the films were also investigated through the UV-Vis spectroscopy (Perkin Elmer™) for the wavelength range of 200 to 2000 nm. Absorptance spectra was calculated using: A (%)=100−(T+R). Where A is the absorptance, T is transmittance, and R is the reflectance. As measured and shown in views (a) to (c) of FIG. 4, Transmission, reflectance and absorptance spectrum vary with different thicknesses for the wavelength range of 200 to 2000 nm. While the transmittance is the highest (85%) for the wavelength (>500 nm) for 20 nm thick film, both absorptance and reflectance are higher for the films above 100 nm. Such results confirm that thickness is an explicit parameter to tune the optical properties.

Figure 5:
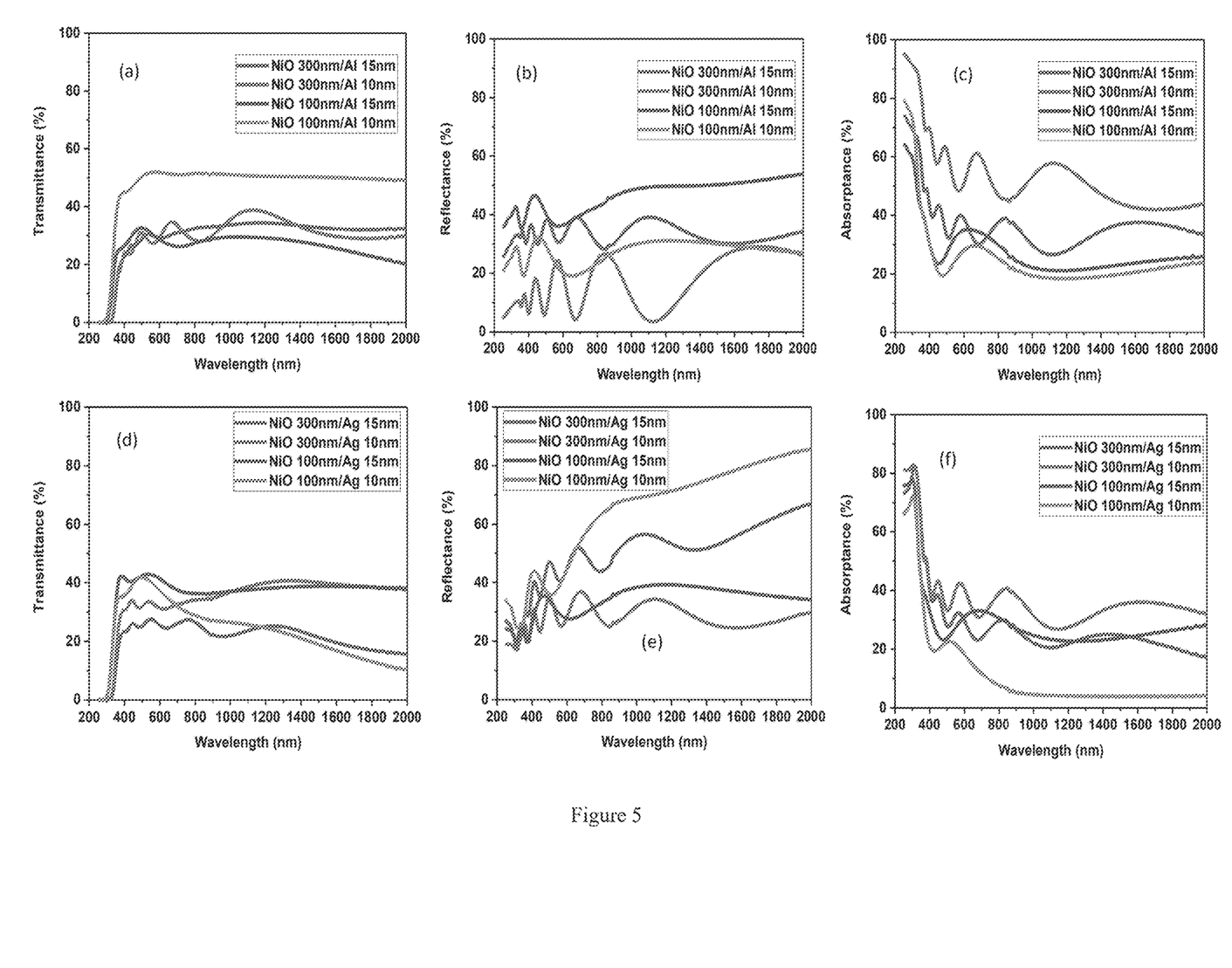
FIG. 5 includes views (a) to (f), which illustrate UV-Vis results of NiO/metal films grown with different thicknesses: (a) transmittance (%) of NiO/Al films, (b) reflectance (%) of NiO/Al films, (c) absorptance (%) of NiO/Al films, (d) transmittance (%) of NiO/Ag films, (e) reflectance (%) of NiO/Ag films, and (f) reflectance (%) of NiO/Al films.

Transmission, reflectance and absorptance spectra confirm a clear difference among all NiO/metal (metal=Al, Ag) films grown with different thicknesses for the wavelength range of 200 to 2000 nm. Hence, thickness effects of both metal oxide and metal layers become explicit parameter for further understanding. Reflection is changing significantly with thickness between 10 nm and 15 nm of the metal layer. In our case, R % should be lowest in visible and highest in IR region to cutoff the infrared spectrum. Among all samples, the lowest R % is for all NiO/metal films except NiO 100 nm/Al 10 nm, NiO 100 nm/Ag 15 nm starting from 700 nm.

Figure 6:
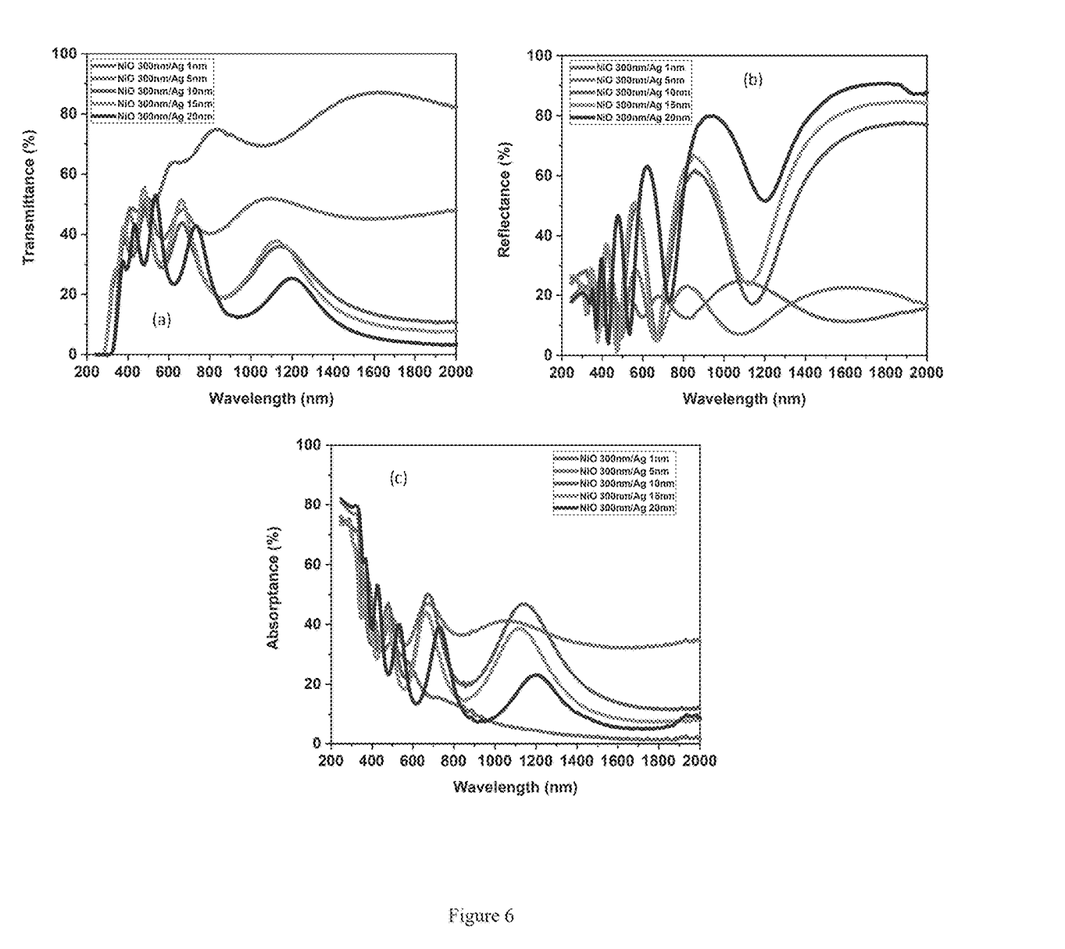
FIG. 6 includes views (a) to (c), which illustrate UV-Vis results of NiO/Ag (thickness=1 nm-20 nm) films: (a) transmittance (%), (b) reflectance (%), and (c) absorptance (%).

Further thickness optimization of both NiO and metal layers were carried out using the thermal e-beam evaporation. As per the results, the highest cut off is for NiO (300)/Ag (20 nm) as shown in views (a) to (c) of FIG. 6. The highest T % is around 45% in the visible range for the metal thickness from 5 nm to 20 nm. The results confirm that the thickness of the metal is key to develop an optimize filter.

Figure 7:
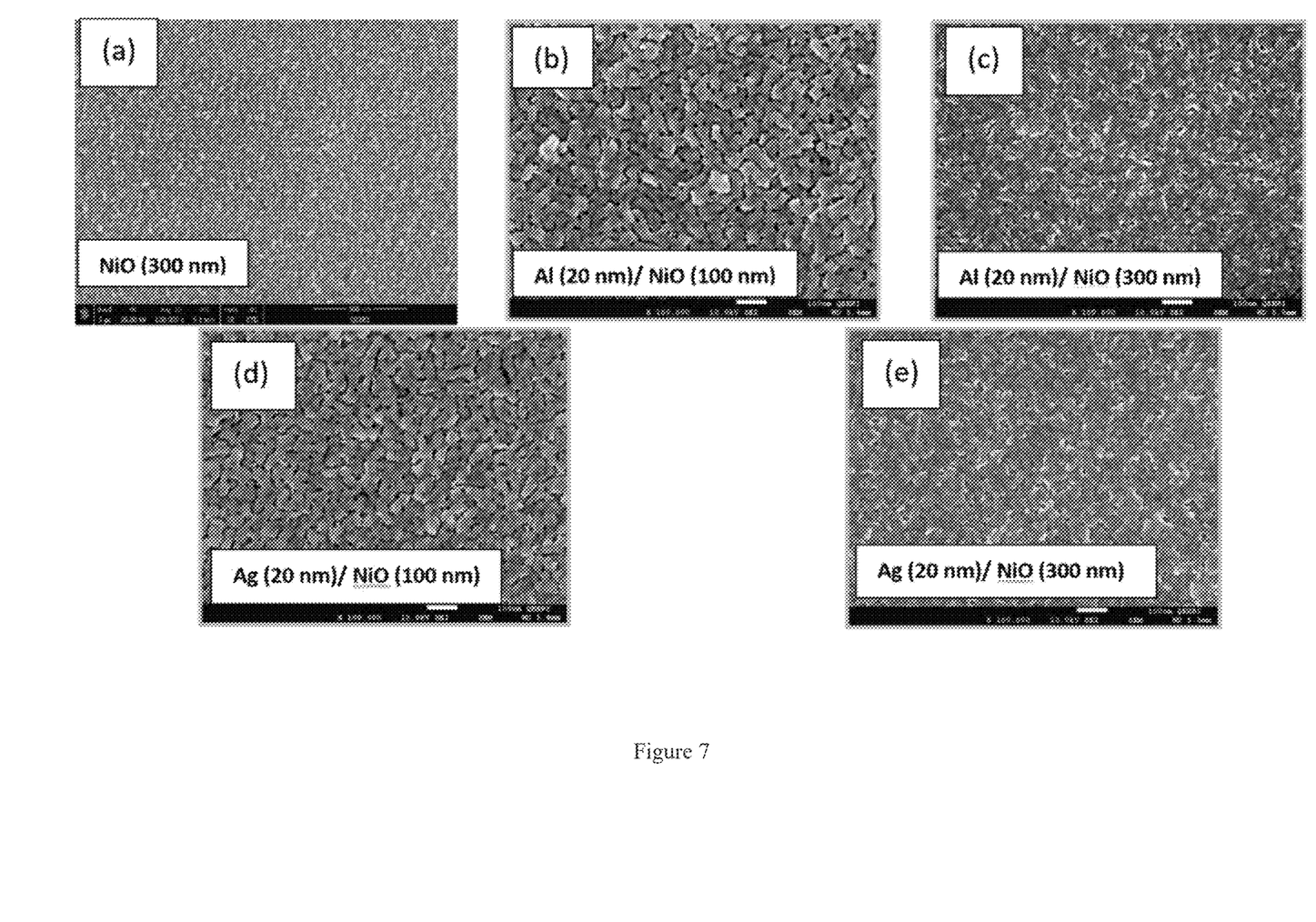
FIG. 7 includes views (a) to (e), which illustrate morphological results of NiO/metal films: (a) NiO (300 nm), (b) Al (10 nm)/NiO (100 nm), (c) Al (20 nm)/NiO (300 nm), (d) Ag (20 nm)/NiO (100 nm), (e) Ag (20 nm)/NiO (300 nm).

FIG. 7, view (a), shows the general surface images of the evaporated NiO with 300 nm of thickness, where FIG. 7, views (b) to (e), capture the top view image after stacking with metal layers (Al, Ag) with the thickness range of 10-15 nm keeping Al and Ag as seed layers. As confirmed by the measurement, all evaporated stacked layers are dense, homogenous, and without any pinholes. As confirmed, evaporated films are with entire coverage and uniformity, which are essential to develop high-end optoelectronic devices such as infrared filters. For our application, it is significantly important to develop films with pristine quality for an optimized light management as cracked surfaces with defects can suppress films properties of reflecting infrared solar spectrum. In our study, metal layers have been used as a template to grow metal oxide layers. As imaged, NiO films of 300 nm show smaller grains and confirm uniform films throughout the entire surface.

Figure 8:
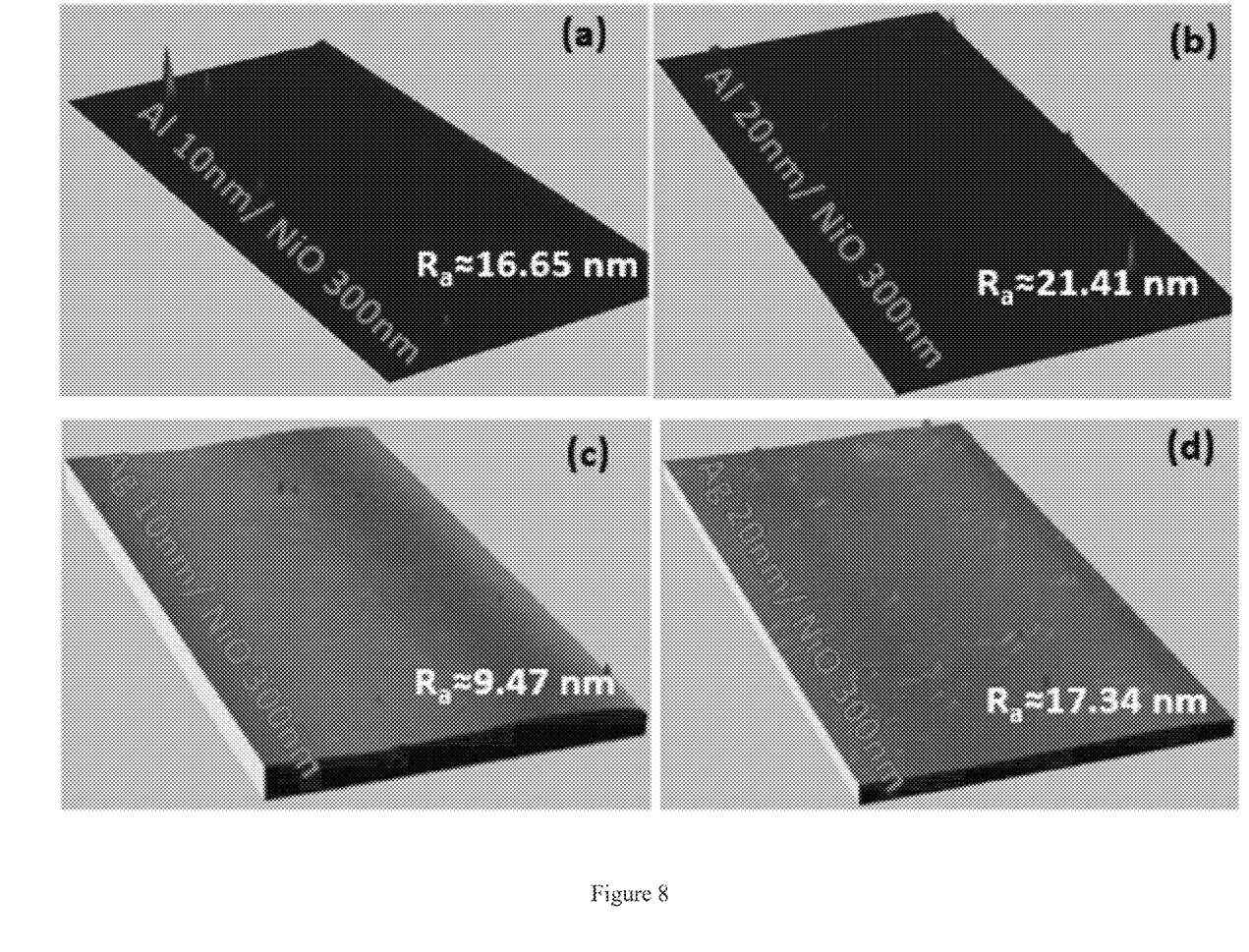
FIG. 8 includes views (a) to (d), which illustrate a roughness study of NiO/metal films: (a) Al (10 nm)/NiO (300 nm), (b) Al (20 nm)/NiO (300 nm), (c) Ag (10 nm)/NiO (300 nm), (d) Ag (20 nm)/NiO (300 nm).

FIG. 8, views (a) to (d), show the average roughness measurement using the 3D mode. The average roughness has changed as confirmed by the measurement with the thickness of the metal layers. As measured, NiO/metal (Al, Ag=20 nm) stacked layers results in the highest average roughness with an average of 17 nm and NiO/metal (Al, Ag=10 nm) layers result in the lowest with an average of 10 nm. Such results can be correlated with the SEM results, where increasing smaller grains have been reported for thicker metal oxide layer. It is crucial to notice that metal layers as play a vital role in tuning the roughness of top layers. The lowest average roughness of the stacked layers is for Ag (15 nm)/NiO (300 nm) with a value of 9.47 nm.

Figure 9:
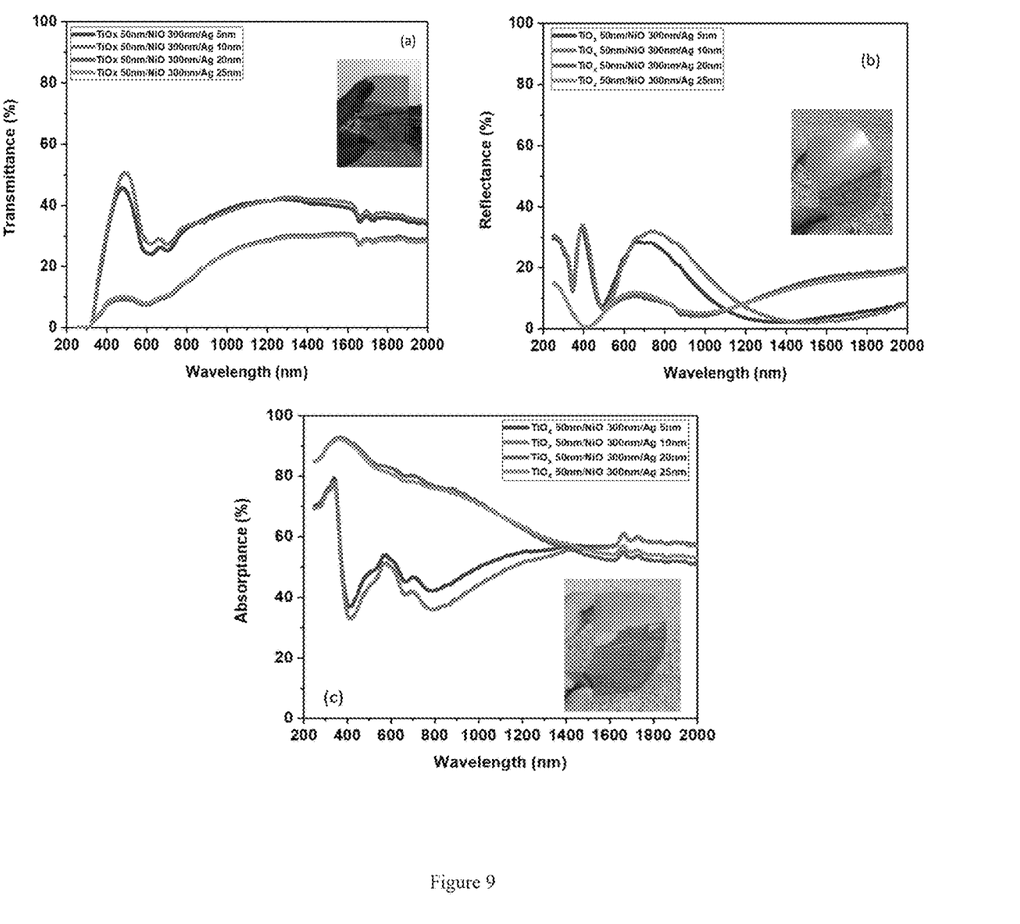
FIG. 9 includes views (a) to (c), which illustrate UV-Vis results of $TiO_x$/NiO/Ag films (a) transmittance (%), (b) reflectance (%), and (c) absorptance (%).

Later, $TiO_x$ films were grown on NiO/Ag/flexible substrates for better light management and to use such stacked layer as anti-soiling coating with lighter weight. Transmission, reflectance and absorptance spectra change accordingly after inserting the top layer $TiO_x$ for the wavelength range of 200 to 2000 nm as shown in FIG. 9. For the films grown with $TiO_x$ (50 nm)/NiO 100 nm/Ag 20 nm and $TiO_x$ (50 nm)/NiO 100 nm/Ag 25 nm show the highest reflection of around 20% starting from (>800 nm).

Figure 10:
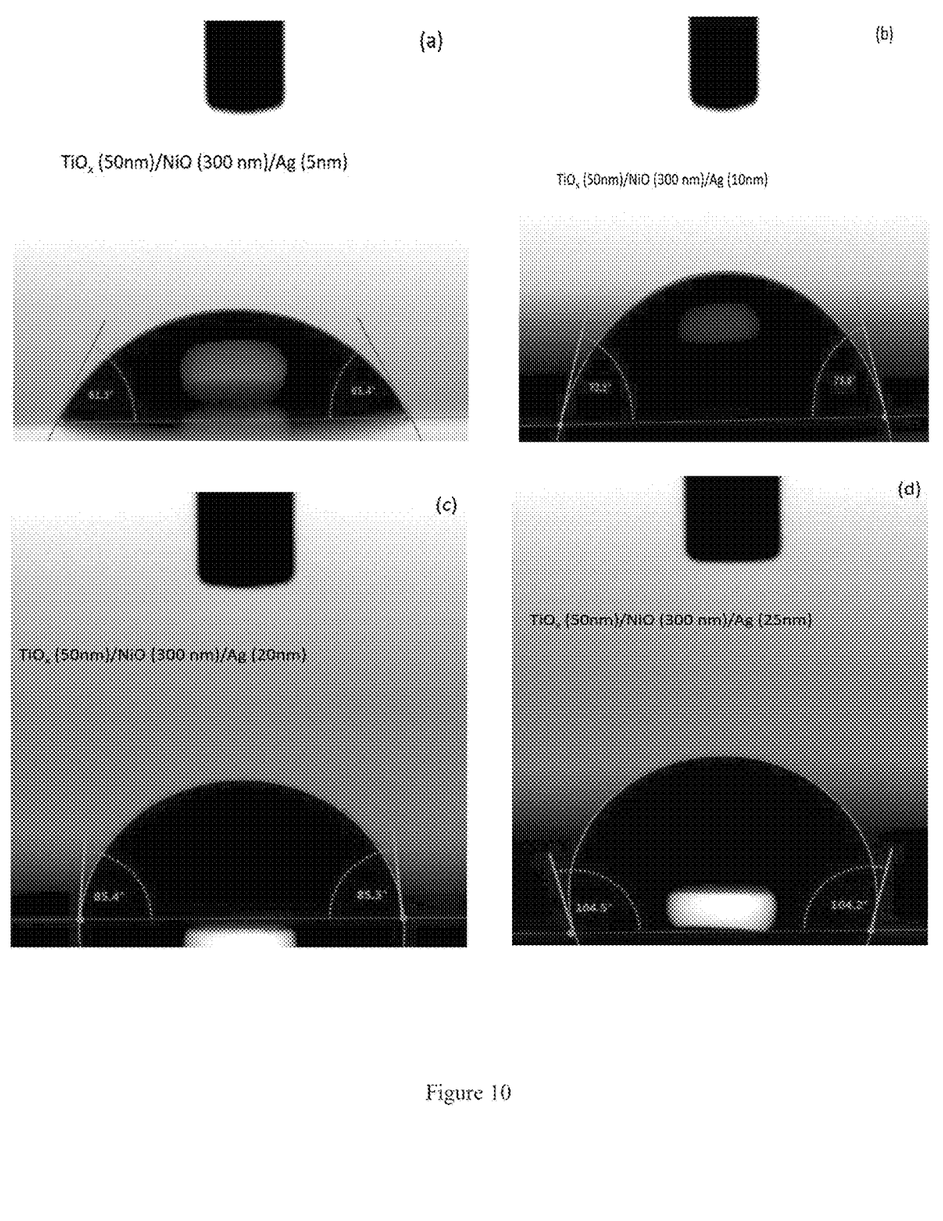
FIG. 10 includes views (a) to (d), which illustrate a contact angle study of NiO/metal films: (a) $TiO_x$ (50 nm)/NiO (300 nm)/Ag (5 nm), (b) $TiO_x$ (50 nm)/NiO (300 nm)/Ag (10 nm), (c) $TiO_x$ (50 nm)/NiO (300 nm)/Ag (20 nm), (d) $TiO_x$ (50 nm)/NiO (300 nm)/Ag (25 nm).

Generally, the wetting behavior of thin films with a contact angle more than 600 can be used for anti-adhesion and anti-soiling applications. Hydrophobic surface can be prepared using high surface energy materials to resist dust accumulation. Such surface phenomenon is the best tangible product to develop anti-soiling coatings, for example in the space industry. In our study, it is inevitably important to tune the surface properties for a hydrophobic surface. As shown in the FIG. 10, $TiO_x$ (50 nm)/NiO (300 nm)/Ag (25 nm) shows the highest hydrophobicity with a CA of about 104°, whereas hydrophilic behavior has been measured for the other stacked films. Previous study confirms that surface wettability changes significantly with roughness. The lowest contact angle measurement of 61.3° has been found for $TiO_x$ (50 nm)/NiO (300 nm)/Ag (5 nm) due to the proportional roughness dependence. It is expected to develop superhydrophobic surface with increasing roughness due to the reduced tension between surface and water molecule.

Infrared spectrum filters are useful to cut-off the infrared wavelengths which cause the heat accumulation. Our developed stacked layers can be used with three different functionalities such as infrared filtering, anti-reflection coating, and anti-soiling coatings in a desert environment. In this work, we have developed such filters using metal oxides and metal layers through stacking by a reactive e-beam evaporation process. Silver (Ag) with a thickness of 20 nm has been used as seed layer to grow NiO and $TiO_x$ layers for the stacking structure. The highest cut off is for NiO (300)/Ag (20 nm) films with a value of >75% above 750 nm. The highest T % is around 45% in the visible range for the metal thickness from 5 nm to 20 nm. Later, flexible substrates were used to develop such IR filter with other functionalities such as anti-reflection and anti-soiling coatings. $TiO_x$ (50 nm)/ NiO (300 nm)/Ag (25 nm) shows the highest hydrophobicity with a CA of about 104°. The results confirm the development of multi-stacked metal oxide/metal oxide/metal films using thermal e-beam evaporation to be used as near infrared light filter, anti-dust and antireflective coatings with large-scale fabrication feasibility.

Without further elaboration, it is believed that one skilled in the art can use the preceding description to utilize the claimed inventions to their fullest extent. The examples and aspects disclosed herein are to be construed as merely illustrative and not a limitation of the scope of the present disclosure in any way. It will be apparent to those having skill in the art that changes may be made to the details of the above-described examples without departing from the underlying principles discussed. In other words, various modifications and improvements of the examples specifically disclosed in the description above are within the scope of the appended claims. For instance, any suitable combination of features of the various examples described is contemplated.

It should be understood that various changes and modifications to the presently preferred embodiments described herein will be apparent to those skilled in the art. Such changes and modifications can be made without departing from the spirit and scope of the present subject matter and without diminishing their intended advantages. It is therefore intended that such changes and modifications be covered by the appended claims.

The invention claimed is:

1. An infrared radiation filter comprising:
a metal layer;
a first metal oxide layer; and
a second metal oxide layer,
wherein the first metal oxide layer is provided between the second metal oxide layer and the metal layer,
wherein the first metal oxide layer is $MoO_x$ or $NiO_x$ where x is greater than zero.

2. The infrared radiation filter according to claim 1, wherein the second metal oxide layer is selected from the group consisting of $TiO_x$, $MoO_x$, and $NiO_x$ where x is greater than zero.

3. The infrared radiation filter according to claim 1, wherein the metal layer is Ag or Al.

4. The infrared radiation filter according to claim 1, wherein the second metal oxide layer is $TiO_x$ where x is greater than zero.

5. The infrared radiation filter according to claim 4, wherein $TiO_x$ has a varying stoichiometry within the second metal oxide layer.

6. The infrared radiation filter according to claim 1, wherein the metal layer is Ag, the first metal oxide layer is $MoO_x$, and the second metal oxide layer is $TiO_x$ where x is greater than zero.

7. The infrared radiation filter according to claim 1, wherein the metal layer is Al, the first metal oxide layer is $MoO_x$, and the second metal oxide layer is $TiO_x$ where x is greater than zero.

8. The infrared radiation filter according to claim 1, wherein the metal layer is Ag, the first metal oxide layer is $NiO_x$, and the second metal oxide layer is $TiO_x$ where x is greater than zero.

9. The infrared radiation filter according to claim 1, wherein the metal layer is Al, the first metal oxide layer is $NiO_x$, and the second metal oxide layer is $TiO_x$ where x is greater than zero.

10. An infrared radiation filter comprising:
a metal layer;
a first metal oxide layer; and
a second metal oxide layer,
wherein the first metal oxide layer is provided between the second metal oxide layer and the metal layer,
wherein the second metal oxide layer is $TiO_x$ where x is greater than zero, and
wherein $TiO_x$ has a varying stoichiometry within the second metal oxide layer.

11. The infrared radiation filter according to claim 10, wherein the first metal oxide layer is selected from the group consisting of $TiO_x$, $MoO_x$, and $NiO_x$ where x is greater than zero.

12. The infrared radiation filter according to claim 10, wherein the metal layer is Ag or Al.

13. The infrared radiation filter according to claim 10, wherein the metal layer is Ag and the first metal oxide layer is $MoO_x$.

14. The infrared radiation filter according to claim 10, wherein the metal layer is Al and the first metal oxide layer is $MoO_x$.

15. The infrared radiation filter according to claim 10, wherein the metal layer is Ag and the first metal oxide layer is $NiO_x$.

16. The infrared radiation filter according to claim 10, wherein the metal layer is Al and the first metal oxide layer is $NiO_x$.

17. An infrared radiation filter comprising:
a metal layer;
a first metal oxide layer; and
a second metal oxide layer,
wherein the first metal oxide layer is provided between the second metal oxide layer and the metal layer,
wherein the metal layer is Ag, the first metal oxide layer is $MoO_x$, and the second metal oxide layer is $TiO_x$ where x is greater than zero.

18. An infrared radiation filter comprising:
a metal layer;
a first metal oxide layer; and
a second metal oxide layer,
wherein the first metal oxide layer is provided between the second metal oxide layer and the metal layer,
wherein the metal layer is Al, the first metal oxide layer is $MoO_x$, and the second metal oxide layer is $TiO_x$ where x is greater than zero.

19. An infrared radiation filter comprising:
a metal layer;
a first metal oxide layer; and
a second metal oxide layer,
wherein the first metal oxide layer is provided between the second metal oxide layer and the metal layer,
wherein the metal layer is Al, the first metal oxide layer is $NiO_x$, and the second metal oxide layer is $TiO_x$ where x is greater than zero.

* * * * *